United States Patent
Kim et al.

(10) Patent No.: US 9,761,473 B2
(45) Date of Patent: Sep. 12, 2017

(54) SUBSTRATE SUPPORTING UNIT AND SUBSTRATE PROCESSING APPARATUS MANUFACTURING METHOD OF THE SUBSTRATE SUPPORTING UNIT

(75) Inventors: Hai Won Kim, Gyeonggi-do (KR); Sung-Kil Cho, Gyeonggi-do (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 242 days.

(21) Appl. No.: 14/234,723

(22) PCT Filed: Aug. 24, 2012

(86) PCT No.: PCT/KR2012/006777
§ 371 (c)(1),
(2), (4) Date: Jan. 24, 2014

(87) PCT Pub. No.: WO2013/048016
PCT Pub. Date: Apr. 4, 2013

(65) Prior Publication Data
US 2014/0174356 A1 Jun. 26, 2014

(30) Foreign Application Priority Data
Sep. 26, 2011 (KR) .................. 10-2011-0096730

(51) Int. Cl.
*C23C 16/00* (2006.01)
*C23C 16/50* (2006.01)
(Continued)

(52) U.S. Cl.
CPC ........ *H01L 21/683* (2013.01); *C23C 16/4585* (2013.01); *H01L 21/67109* (2013.01); *H01L 21/68735* (2013.01); *Y10T 29/49764* (2015.01)

(58) Field of Classification Search
USPC ............ 118/500, 715, 722, 728–732; 156/345.51–345.55; 29/407.01
See application file for complete search history.

(56) References Cited

U.S. PATENT DOCUMENTS 5,632,873 A * 5/1997 Stevens .................. C23C 14/50
118/503
5,868,847 A * 2/1999 Chen ...................... C23C 14/50
118/715
(Continued)

FOREIGN PATENT DOCUMENTS

JP 2003-007694 A 1/2003
KR 10-2001-0090375 A 10/2001
(Continued)

*Primary Examiner* — Karla Moore
*Assistant Examiner* — Tiffany Nuckols
(74) *Attorney, Agent, or Firm* — Rabin & Berdo, P.C.

(57) ABSTRACT

Provided are a substrate supporting unit and a substrate processing apparatus, and a method of manufacturing the substrate supporting unit. The substrate supporting unit includes a susceptor on which a substrate is placed on a top surface thereof, one or more heat absorbing members which are capable of being converted between a mounted position at which the heat absorbing member is disposed on an upper portion of the susceptor to thermally contact the susceptor and a released position at which the heat absorbing member is separated from the upper portion of the susceptor, the one or more heat absorbing members absorbing heat of the susceptor at the mounted position, and an edge ring having a plurality of fixing slots in which the heat absorbing members are selectively inserted and fixed.

10 Claims, 6 Drawing Sheets

(51) Int. Cl.
    *C23F 1/00*          (2006.01)
    *H01L 21/306*      (2006.01)
    *H01L 21/683*      (2006.01)
    *C23C 16/458*      (2006.01)
    *H01L 21/67*       (2006.01)
    *H01L 21/687*      (2006.01)

(56) References Cited

U.S. PATENT DOCUMENTS

| | | | | |
|---|---|---|---|---|
| 5,997,651 | A * | 12/1999 | Matsuse | C23C 16/455 |
| | | | | 118/715 |
| 6,168,668 | B1 * | 1/2001 | Yudovsky | H01L 21/68 |
| | | | | 118/715 |
| 6,261,408 | B1 * | 7/2001 | Schneider | C23C 16/4412 |
| | | | | 118/715 |
| 6,531,069 | B1 * | 3/2003 | Srivastava | H01J 37/32623 |
| | | | | 118/723 R |
| 6,585,851 | B1 * | 7/2003 | Ohmi | H01J 37/32082 |
| | | | | 118/723 E |
| 2003/0066484 | A1 * | 4/2003 | Morikage | H01J 37/32009 |
| | | | | 118/723 E |
| 2010/0064972 | A1 | 3/2010 | Yamasaki et al. | |
| 2010/0319855 | A1 | 12/2010 | Lee et al. | |

FOREIGN PATENT DOCUMENTS

KR     10-2010-0014643 A     2/2010
KR        10-0943427 B1     2/2010

* cited by examiner

SUBSTRATE SUPPORTING UNIT AND SUBSTRATE PROCESSING APPARATUS MANUFACTURING METHOD OF THE SUBSTRATE SUPPORTING UNIT

CROSS-REFERENCE TO RELATED APPLICATIONS

This U.S. non-provisional patent application claims priority under 35 U.S.C. §119 of Korean Patent Application No. 10-2011-0096730, filed on Sep. 26, 2011, the entire contents of which is hereby incorporated by reference.

BACKGROUND OF THE INVENTION

The present invention disclosed herein relates to a substrate supporting unit and a substrate processing apparatus, and a method of manufacturing the substrate supporting unit, and more particularly, to a substrate support unit which enables a susceptor to have a uniform temperature distribution and a substrate processing apparatus, and a method of manufacturing the substrate supporting unit.

Semiconductor manufacturing processes include a deposition process or an etching process which is performed on a wafer. When the deposition or etching process is performed, a wafer is heated at a temperature of about 500° C. to about 700° C. by a resistance heater or a lamp heater in a state where the wafer is loaded on a susceptor formed of a ceramic or metal material.

In this case, to secure process uniformity, it is necessary to uniformly distribute a temperature on the wafer. For this, it may be necessary to uniformly adjust a temperature distribution of a susceptor.

SUMMARY OF THE INVENTION

The present invention provides a substrate supporting unit which can uniformly adjust a temperature distribution on a wafer and a substrate process apparatus, and a method of manufacturing the substrate supporting unit.

The present invention also provides a substrate supporting unit which can uniformly adjust a temperature distribution on a susceptor and a substrate process apparatus, and a method of manufacturing the substrate supporting unit.

Further another object of the present invention will become evident with reference to following detailed descriptions and accompanying drawings.

Embodiments of the present invention provide substrate supporting units including: a susceptor on which a substrate is placed on a top surface thereof; one or more heat absorbing members which are capable of being converted between a mounted position at which the heat absorbing member is disposed on an upper portion of the susceptor to thermally contact the susceptor and a released position at which the heat absorbing member is separated from the upper portion of the susceptor, the one or more heat absorbing members absorbing heat of the susceptor at the mounted position; and an edge ring having a plurality of fixing slots in which the heat absorbing members are selectively inserted and fixed.

In some embodiments, the susceptor may have a central region in which the substrate is disposed and an edge region defined around the substrate, and the heat absorbing members may be disposed along the edge region at the mounted position.

In other embodiments, the edge ring may have a ring shape and be disposed along the edge region of the susceptor, and the fixing slots may be penetrated in radius directions of the susceptor.

In still other embodiments, the heat absorbing members may have thermal contact surfaces thermally contacting the susceptor, and the thermal contact surfaces may have different areas.

In even other embodiments, each of the heat absorbing members may be formed of a material including one of aluminum oxide ($Al_2O_3$) and aluminum nitride (AlN).

In other embodiments of the present invention, substrate processing apparatuses include: a chamber providing an inner space in which processes are performed on a substrate; a substrate supporting unit disposed within the chamber to support the substrate; and a showerhead supplying a process gas onto a top surface of the substrate supported by the substrate supporting unit, wherein the substrate supporting unit includes: a susceptor on which a substrate is placed on a top surface thereof; one or more heat absorbing members which are capable of being converted between a mounted position at which the heat absorbing member is disposed on an upper portion of the susceptor to thermally contact the susceptor and a released position at which the heat absorbing member is separated from the upper portion of the susceptor, the one or more heat absorbing members absorbing heat of the susceptor at the mounted position; and an edge ring having a ring shape and disposed along a sidewall of the chamber, the edge ring having a plurality of fixing slots in which the heat absorbing members are selectively inserted and fixed.

In still other embodiments of the present invention, methods of manufacturing a substrate supporting unit including a susceptor, on which a substrate is placed, include: measuring a temperature distribution of the susceptor to determine one or more high temperature regions, each having a high temperature greater than a reference temperature, of the substrate; disposing an edge ring having a plurality of fixing slots on the substrate; and selectively inserting and fixing heat absorbing members into the fixing slots respectively corresponding to the high temperature regions to adjust the temperature distribution of the susceptor.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
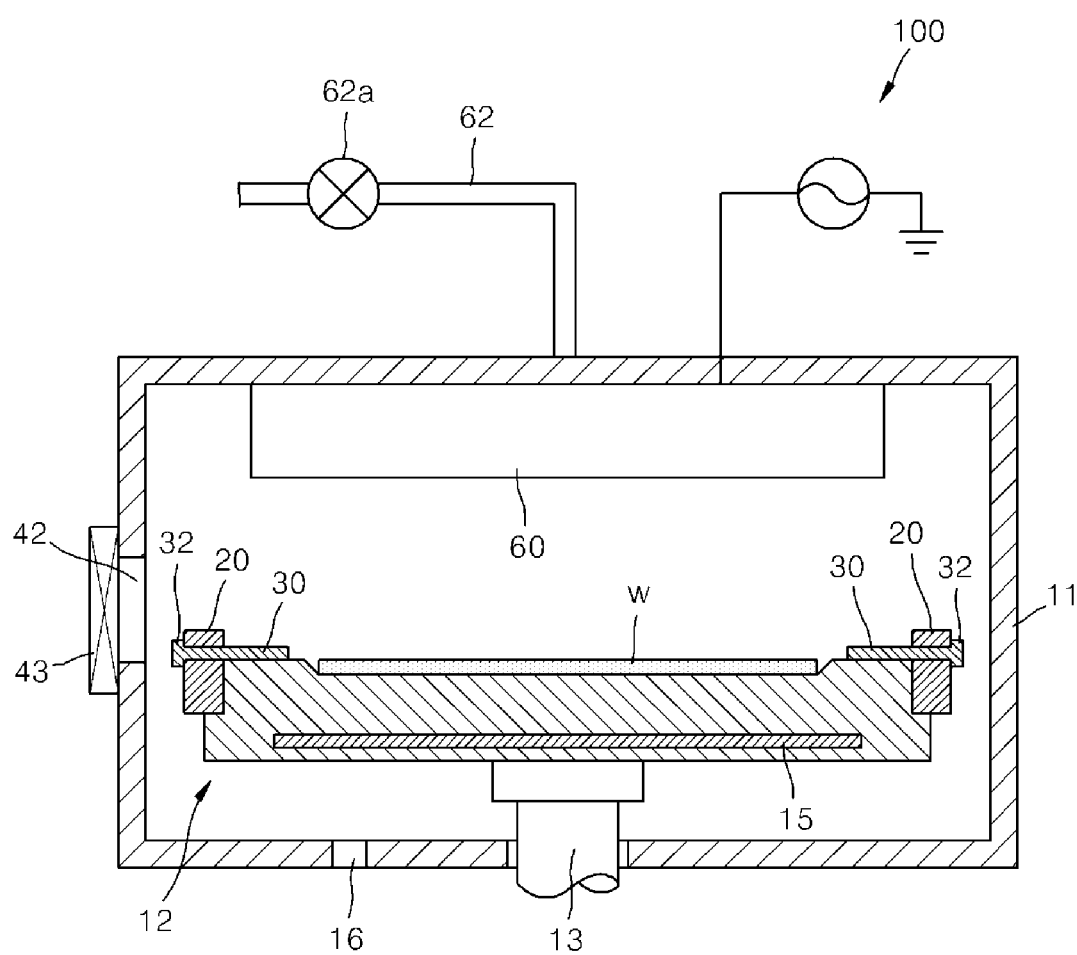
FIG. 1 is a schematic view of a substrate processing apparatus according to an embodiment of the present invention.

Hereinafter, exemplary embodiments of the present invention will be described in detail with reference to FIGS. 1 to 6. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the drawings, the shapes of components are exaggerated for clarity of illustration.

Although a deposition device is exemplified below, the present invention may be applicable to various substrate processing apparatuses including a substrate supporting unit. Also, although a wafer W is exemplified below, the present invention may be applicable to various objects to be processed.

FIG. 1 is a schematic view of a substrate processing apparatus 100 according to an embodiment of the present invention. The substrate processing apparatus 100 is an apparatus for depositing a layer. The substrate processing apparatus 100 includes a chamber 11 having a cylindrical shape. A susceptor 12 having a circular plate shape and horizontally supporting the wafer W is disposed within the chamber 11. The susceptor 12 is supported by a supporting member 13. For example, the susceptor 12 may be formed of a ceramic material such as aluminum oxide ($Al_2O_3$) or aluminum nitride (AlN).

A heater 15 is installed within the susceptor 12. The heater 15 includes a coil type heater or a pattern heater. The heater 15 heats the susceptor 12 using a power supplied from the outside. The wafer W is heated at a predetermined temperature by the heater 15. The susceptor 12 may include a thermocouple (not shown). The thermocouple may detect a temperature of the susceptor 12 to control the temperature of the susceptor 12. Although the integrated heater 15 is exemplified in the current embodiment, the heater 15 may be divided into a plurality of parts to separately heat regions of the susceptor 12.

A showerhead 60 is installed on a ceiling within the chamber 11. The showerhead 60 supplies process gases supplied from a gas supply line 62 onto the susceptor 12. Here, the gas supply line 62 is opened or closed by a valve 62a. A high frequency power source is connected to the showerhead 60. As needed, a high frequency power having a predetermined frequency may be supplied into the showerhead 60 from the high frequency power source.

An exhaust hole 16 is defined in the bottom of the chamber 11. The process gases and reaction byproducts may be discharged to the outside through the exhaust hole 16. Also, the inside of the chamber 11 may be decompressed up to a predetermined vacuum degree through the exhaust hole 16. A passage 42 through which the wafer W is loaded or unloaded and a gate valve 43 for opening or closing the passage 42 are disposed in a sidewall of the chamber 11.

Figure 2:
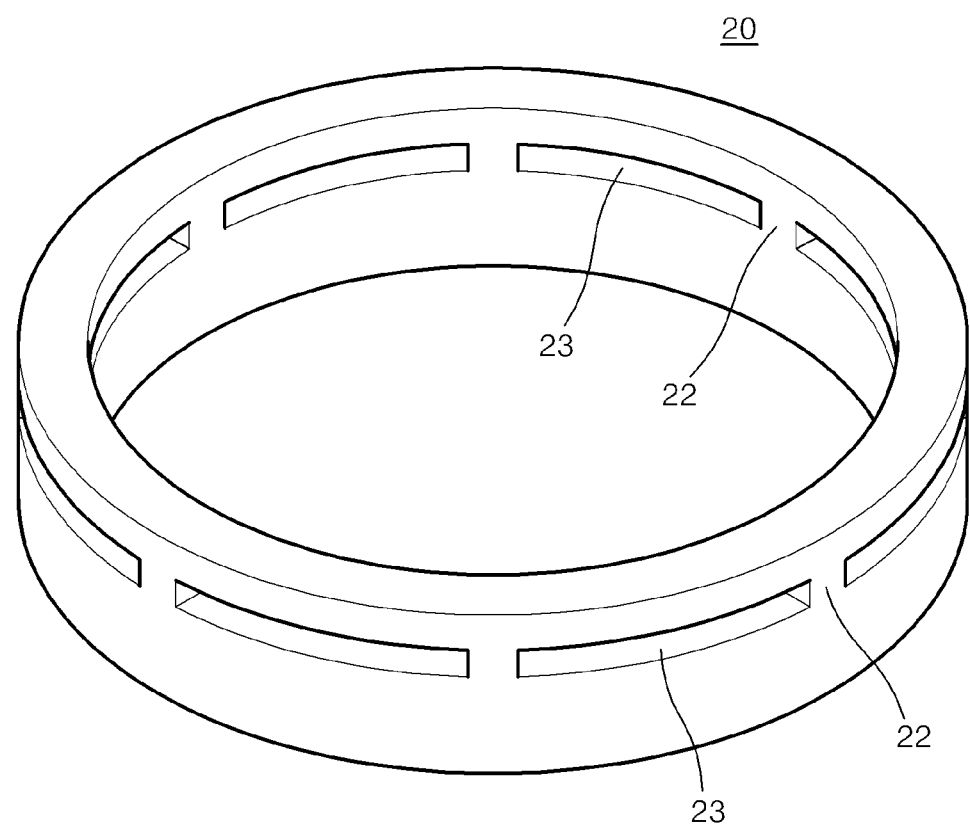
FIG. 2 is a perspective view of an edge ring of FIG. 1.

An edge ring 20 is disposed on an upper portion of the susceptor 12. FIG. 2 is a perspective view of the edge ring of FIG. 1. Referring to FIG. 2, the edge ring 20 has a ring shape. Also, the edge ring 20 is disposed on the upper portion of the susceptor 12 along an edge region of the susceptor 12. That is, the wafer W is placed on a central region of the susceptor 12, and the edge ring 20 is disposed on the edge region defined around the wafer W. The edge ring 20 has a plurality of fixing slots 23. The fixing slots 23 pass in a radius direction of the edge ring 20. The fixing slots 23 are divided by a plurality of partition walls 22. Each of the fixing slots 23 may be adjusted in size (or width) according to positions of the partition walls 22.

As shown in FIG. 1, the heat absorbing member 30 is inserted into the edge ring 20. The heat absorbing member 30 is fixedly inserted into one of the fixing slots 23 of the edge ring 20 to thermally contact a top surface of the susceptor 12 ("mounted position"). The thermal contact means that heat can be transmitted into the heat absorbing member 30. That is, the thermal contact means that the heat absorbing member 30 directly contacts the top surface of the susceptor 12 or indirectly contacts the top surface of the susceptor 12 through a separate medium.

The heat absorbing member 30 is disposed on a specific region of the susceptor 12 to absorb heat with the specific region. Thus, when the susceptor 12 is heated in the same manner through the heater 15, a temperature of the specific region measured after the heat absorbing member 30 is installed is lower than that of the specific region measured before the heat absorbing member 30 is installed. That is, the heat absorbing member 30 may act as a thermal loss with respect to the susceptor 12. As a result, the susceptor 12 may be adjusted to have a uniform temperature distribution.

Figure 3:
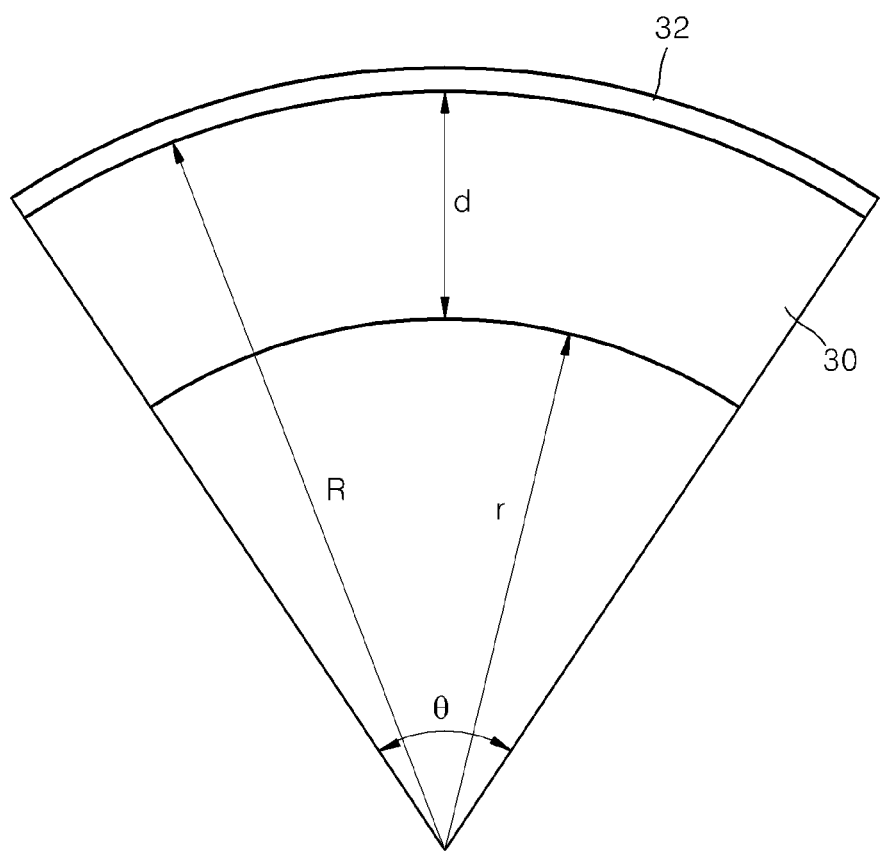
FIG. 3 is a view of a heat absorbing member of FIG. 1.

FIG. 3 is a view of the heat absorbing member of FIG. 1. Referring to FIG. 3, the heat absorbing member 30 has a thermal contact surface having a rainbow shape with an outer radius R and an inner radius r. The thermal contact surface thermally contacts the top surface of the susceptor 12. A central angle θ of the heat absorbing member 30 may be determined according to the size (or the width) of each of the fixing slots 23. A contact distance d of the heat absorbing member 30 may be obtained through a difference between the outer radius R and the inner radius r. The contact distance d of the heat absorbing member 30 may be a factor which determines an area of the heat absorbing member 30. Also, the area of the heat absorbing member 30 may be a factor which determines a quantity of heat absorbed from the susceptor 12. The area of the heat absorbing member 30 may be obtained through the outer radius R, the inner radius r, and the central angle θ.

A quantity of heat absorbed into the heat absorbing member 30 from the susceptor 12 is substantially proportional to the area of the heat absorbing member 30. Thus, to adjust the temperature distribution of the susceptor 12, it is necessary to provide the heat absorbing member 30 having various shapes (or areas). This is done because temperatures of the susceptor 12 are variously distributed on regions of the susceptor 12. Thus, the heat absorbing member 30 of FIG. 4 may be modified in various shapes. Therefore, the heat absorbing member 30 having various shapes may be provided.

The heat absorbing member 30 may be formed of the same material as the susceptor 12. For example, the heat absorbing member 30 may be formed of one of aluminum oxide ($Al_2O_3$) and aluminum nitride (AlN). As shown in FIGS. 1 and 3, the heat absorbing member 30 includes a support guide 32. The support guide 32 prevents the heat absorbing member 30 from being excessively inserted into the susceptor 12.

Figure 4:
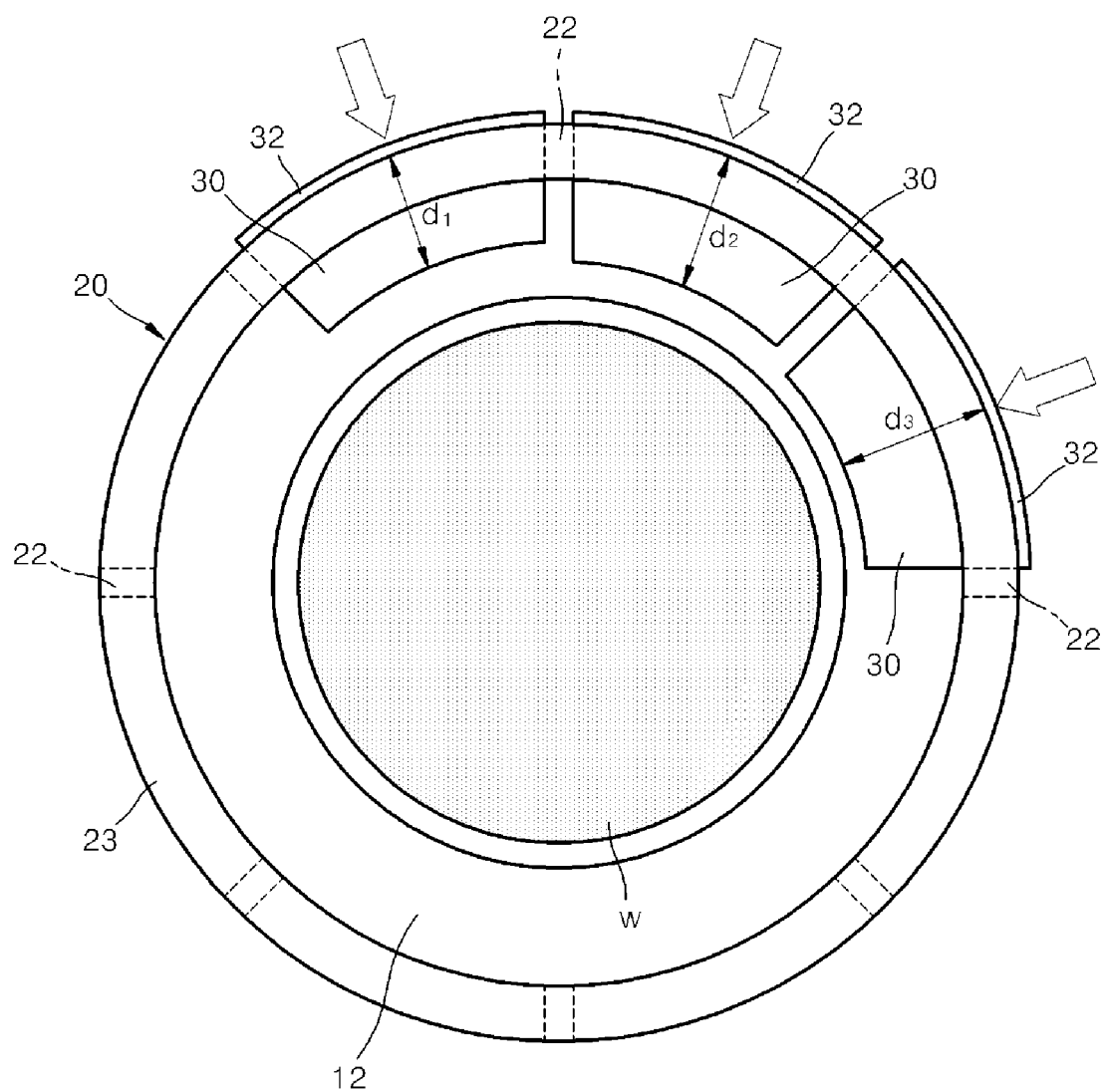
FIG. 4 is a view illustrating a process in which the heat absorbing member is selectively inserted into the edge ring of FIG. 1.

FIG. 4 is a view illustrating a process in which the heat absorbing member is selectively inserted into the edge ring of FIG. 1. A method for adjusting a temperature distribution of the susceptor using the heat absorbing member will be described with reference to FIG. 4.

First, a worker measures a temperature distribution of the susceptor 12. Then, the worker may confirm at least one high temperature region having a temperature greater than a reference temperature through the measured temperature distribution. Here, the reference temperature may be set to a minimum temperature of the measured temperatures or set to a mean temperature of the measured temperatures. The temperature distribution of the susceptor 12 may be measured in a state where the edge ring 20 is disposed on the susceptor 12.

Thereafter, as shown in FIG. 4, the worker may insert the heat absorbing member 30 into the fixing slot 23 corresponding to the confirmed high temperature region. Here, a shape (or an area) of the heat absorbing member 30 may be determined in proportion to a temperature deviation (a difference between the high temperature and the reference temperature) in the high temperature region. An area of the heat absorbing member 30 may be determined according to contact distances d1, d2, and d3. The heat absorbing member 30 is inserted into the fixing slot 23 inward from the outside of the edge ring 20. The support guide 32 prevents the heat absorbing member 30 from being excessively inserted.

In the state where the heat absorbing member 30 is inserted into the fixing slot 23, the heat absorbing member 30 contacts the top surface of the susceptor 12 to absorb heat of the susceptor 12, thereby reducing a temperature of a corresponding region of the susceptor 12. As shown in FIG. 4, the heat absorbing member 30 is not inserted into the fixing slots corresponding to regions of the susceptor 12, each having temperatures less than the reference temperature. Here, the heat absorbing member 30 is separated from the edge ring 20 ("a released position").

Although the edge ring 20 includes eight fixing slots 23 in the current embodiment, the present invention is not limited thereto. For example, the number of fixing slots may be increased to accurately adjust the temperature distribution of the susceptor 12. For example, if the edge ring 20 includes sixteen fixing slots 23, the temperature distribution of the susceptor 12 may be more accurately adjusted through the sixteen fixing slots 23.

As described above, the temperature distribution of the susceptor 12 may be easily adjusted. Also, as described above, although it is necessary to uniformly adjust a temperature distribution of the susceptor 12 so as to secure the process uniformity, the temperature distribution of the susceptor 12 may be affected by external conditions (a shape of the chamber, a position of the passage, and the like). Thus, it is impossible to manufacture a susceptor which can have a uniform temperature distribution when the susceptor 12 is initially manufactured. However, if the edge ring 20 and the heat absorbing member 30 are used, the heat absorbing member 30 having various sizes may be fixedly inserted into the fixing slot 23 of the edge ring 20 after the edge ring 20 is disposed on the susceptor 12 to effectively adjust the temperature distribution of the susceptor 12, thereby minimizing a time and cost required for adjusting the temperature distribution of the susceptor 12. Particularly, even though the external conditions are changed, a nonuniform temperature distribution may be minimized through the heat absorbing member 30. Thus, the substrate processing apparatus may be effectively utilized for various processes.

Figure 5:
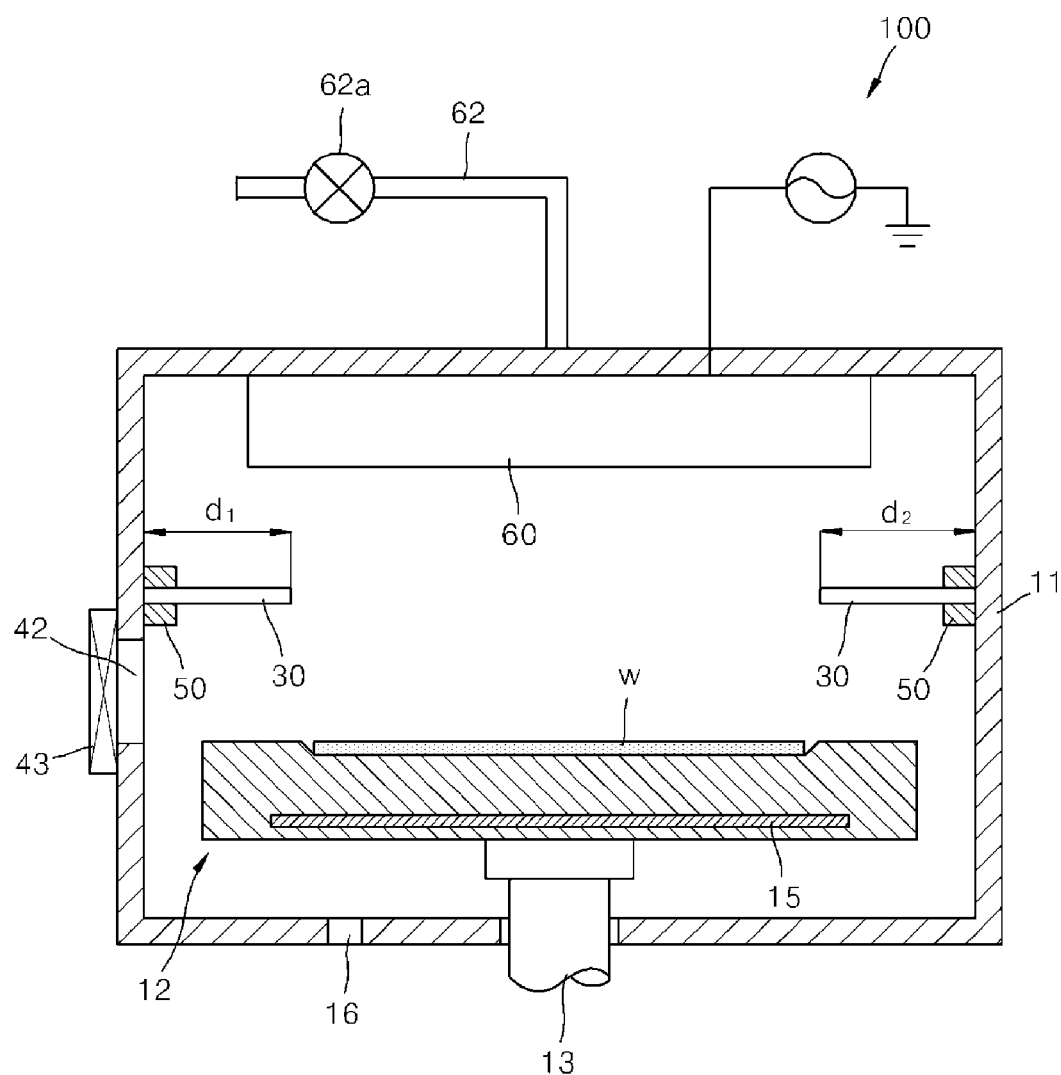
FIG. 5 and FIG. 6 are views illustrating a substrate processing apparatus according to another embodiment of the present invention.
Figure 6:
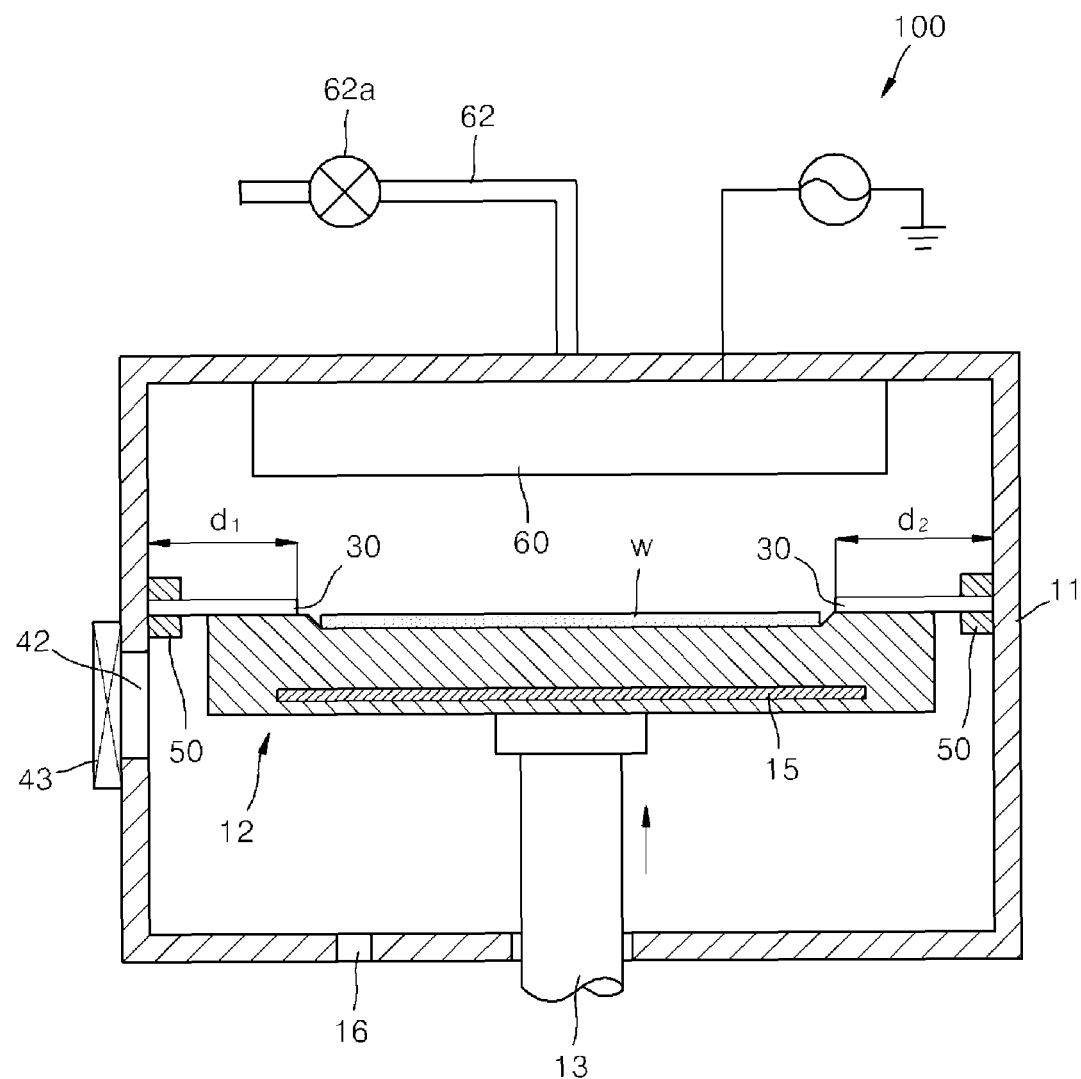

FIG. 5 and FIG. 6 are views illustrating a substrate processing apparatus according to another embodiment of the present invention. In the foregoing embodiment of FIG. 1, the edge ring 20 is disposed on the upper portion of the susceptor 12. However, as shown in FIG. 5, an edge ring 50 may be disposed along a sidewall of a chamber 11 and spaced apart from a top surface of a susceptor 12. A heat absorbing member 30 may be fixedly inserted into the edge ring 50.

Referring to FIG. 6, the susceptor 12 may ascend to perform a process. In a state where the susceptor 12 ascends, the heat absorbing member 30 is maintained in thermal contact with the top surface of the susceptor 12. Thus, the heat absorbing member 30 may absorb heat of a corresponding region of the susceptor 12 through the same method as that of the foregoing embodiment to adjust a temperature distribution of the susceptor 12. Here, like the foregoing embodiment, contact distances d1 and d2 (or areas) of the heat absorbing member 30 may be different from each other according to a quantity of heat to be absorbed from the susceptor 12.

According to the present invention, it may be possible to uniformly adjust a temperature distribution on the wafer. Also, it may be possible to uniformly adjust a temperature distribution on the susceptor.

Although the present invention is described in detail with reference to the exemplary embodiments, the invention may be embodied in many different forms. Thus, technical idea and scope of claims set forth below are not limited to the preferred embodiments.

What is claimed is:

1. A substrate supporting unit comprising:
a susceptor on which a substrate is placed on a top surface thereof;
one or more heat absorbing members which are configured to be converted between a mounted position at which the heat absorbing members are disposed on an upper portion of the susceptor and a released position at which the heat absorbing members are separated from the upper portion of the susceptor, the one or more heat absorbing members absorbing heat of the susceptor at the mounted position; and
an edge ring having a plurality of fixing slots in which the heat absorbing members are selectively inserted and fixed, each fixing slot being defined by an inner lower surface, an inner side surface and an inner upper surface of the edge ring,
wherein the plurality of fixing slots comprise both closed slots into which the heat absorbing members are inserted and opened slots into which the heat absorbing members are not inserted, and
wherein, at the mounted position, the edge ring is disposed to surround an outer circumferential surface of the susceptor, the inner lower surface of the edge ring is disposed to be coplanar with the top surface of the susceptor, and a lower surface of the heat absorbing members is disposed to come in physical contact with both of the inner lower surface of the edge ring and the top surface of the susceptor.

2. The substrate supporting unit of claim 1, wherein the susceptor has a central region in which the substrate is disposed and an edge region defined around the substrate, and
the heat absorbing members are disposed along the edge region at the mounted position.

3. The substrate supporting unit of claim 1, wherein the edge ring has a ring shape and is disposed along the edge region of the susceptor, and
the fixing slots are penetrated in radius directions of the susceptor.

4. The substrate supporting unit of claim 1, wherein the heat absorbing members have thermal contact surfaces thermally contacting the susceptor, and
the thermal contact surfaces have different areas.

5. The substrate supporting unit of claim 1, wherein each of the heat absorbing members is formed of a material comprising one of aluminum oxide (Al2O3) and aluminum nitride (AlN).

6. The substrate supporting unit of claim 1, wherein at the mounted position, a bottom of the edge ring is disposed at a level lower than the top surface of the susceptor and a top of the edge ring is disposed at a level higher than the top surface of the susceptor.

7. A substrate processing apparatus comprising:
a chamber configured to provide an inner space in which processes are performed on a substrate;
a substrate supporting unit disposed within the chamber to support the substrate; and
a showerhead configured to supply process gases onto a top surface of the substrate supported by the substrate supporting unit,
wherein the substrate support uniting comprises:
a susceptor on which a substrate is placed on a top surface thereof;
one or more heat absorbing members which are configured to be converted between a mounted position at which the heat absorbing members are disposed on an upper portion of the susceptor and a released position at which the heat absorbing members are separated from the upper portion of the susceptor, the one or more heat absorbing members absorbing heat of the susceptor at the mounted position; and
an edge ring having a ring shape and disposed along a sidewall of the chamber, the edge ring having a plurality of fixing slots in which the heat absorbing members are selectively inserted and fixed, each fixing slot being defined by an inner lower surface, an inner side surface and an inner upper surface of the edge ring,
wherein the plurality of fixing slots comprise both closed slots into which the heat absorbing members are inserted and opened slots into which the heat absorbing members are not inserted, and
wherein, at the mounted position, the edge ring is disposed to surround an outer circumferential surface of the susceptor, the inner lower surface of the edge ring is disposed to be coplanar with the top surface of the susceptor, and a lower surface of the heat absorbing members is disposed to come in physical contact with both of the inner lower surface of the edge ring and the top surface of the susceptor.

8. The substrate processing apparatus of claim 7, wherein the susceptor has a central region in which the substrate is disposed and an edge region defined around the substrate, and
the heat absorbing members are disposed along the edge region at the mounted position.

9. The substrate processing apparatus of claim 7, wherein the heat absorbing members have thermal contact surfaces thermally contacting the susceptor, and
the thermal contact surfaces have different areas.

10. The substrate processing apparatus of claim 7, wherein at the mounted position, a bottom of the edge ring is disposed at a level lower than the top surface of the susceptor and a top of the edge ring is disposed at a level higher than the top surface of the susceptor.

* * * * *